United States Patent
Liu et al.

(10) Patent No.: US 11,935,747 B2
(45) Date of Patent: Mar. 19, 2024

(54) METHOD OF MANUFACTURING A SEMICONDUCTOR DEVICE

(71) Applicant: TAIWAN SEMICONDUCTOR MANUFACTURING COMPANY, LTD., Hsinchu (TW)

(72) Inventors: Yen-Hsin Liu, New Taipei (TW); Ming-Jhih Kuo, Hsinchu County (TW); Chun-Yen Tai, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 346 days.

(21) Appl. No.: 17/363,452

(22) Filed: Jun. 30, 2021

(65) Prior Publication Data

US 2023/0005737 A1 Jan. 5, 2023

(51) Int. Cl.
*H01L 23/00* (2006.01)
*G03F 7/16* (2006.01)
*H01L 21/027* (2006.01)

(52) U.S. Cl.
CPC .......... *H01L 21/0273* (2013.01); *G03F 7/162* (2013.01)

(58) Field of Classification Search
CPC .......................... H01L 21/0273; G03F 7/162
See application file for complete search history.

(56) References Cited

U.S. PATENT DOCUMENTS

2020/0159110 A1 * 5/2020 Weng .................. G03F 7/38

* cited by examiner

*Primary Examiner* — Anthony Ho
(74) *Attorney, Agent, or Firm* — Birch, Stewart, Kolasch & Birch, LLP

(57) ABSTRACT

A method of manufacturing a semiconductor device includes depositing a photoresist material over a substrate. The substrate is rotated to spread the photoresist material. A gas is blown to an edge of the substrate when rotating the substrate. The rotating of the substrate is stopped. The blowing of the gas is stopped.

20 Claims, 19 Drawing Sheets

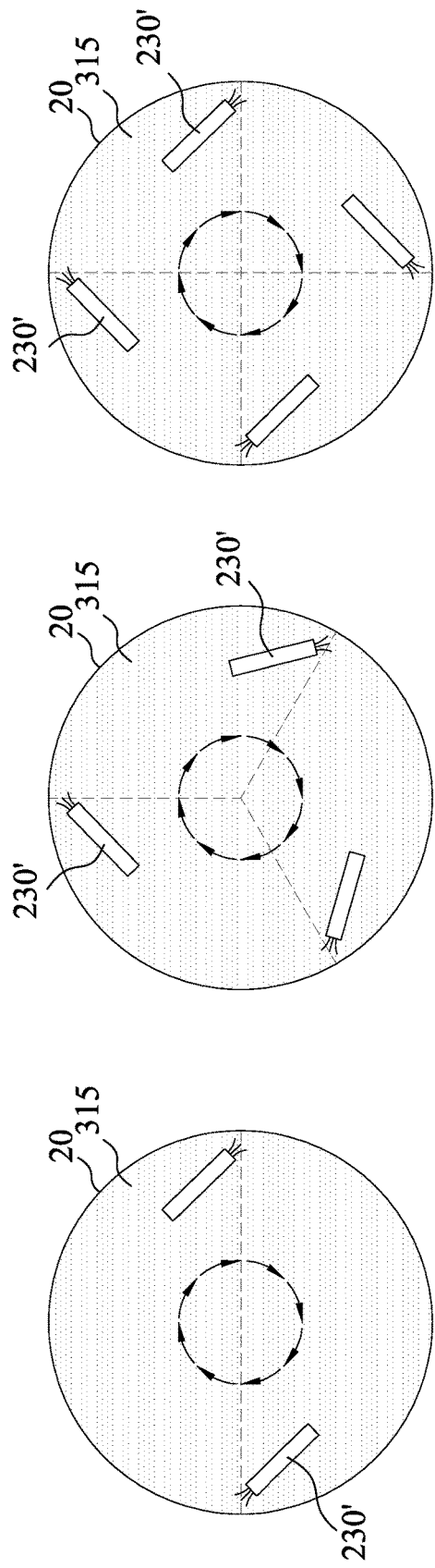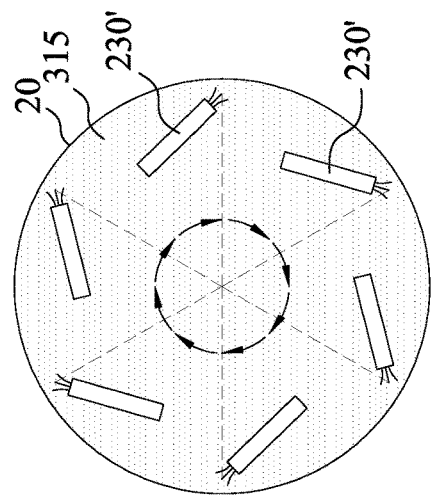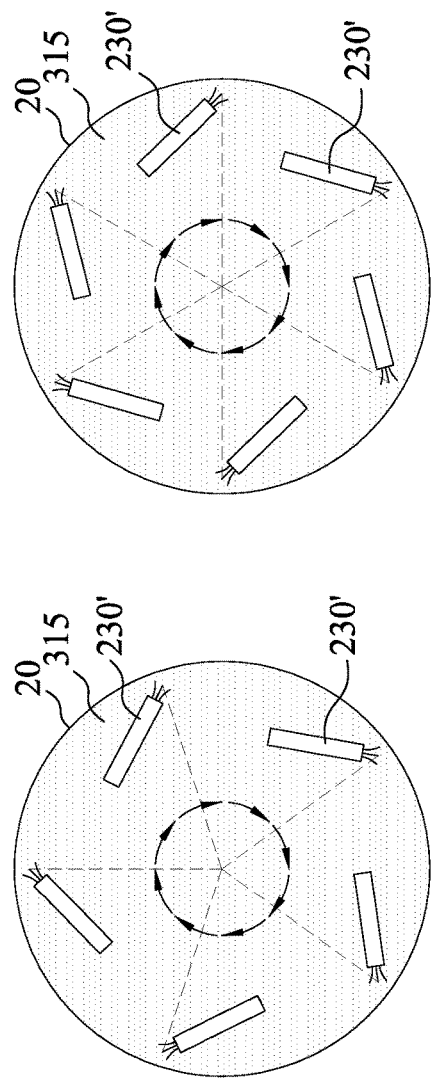
Fig. 8  Fig. 9  Fig. 10  Fig. 11  Fig. 12

METHOD OF MANUFACTURING A SEMICONDUCTOR DEVICE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling-down has also increased the complexity of processing and manufacturing ICs.

A lithography exposure process forms a patterned photoresist layer for various patterning processes, such as etching or ion implantation. In a lithography exposure process, a photosensitive layer (resist) is applied to a surface of a semiconductor substrate, and an image of features defining parts of the semiconductor device is provided on the layer by exposing the layer to a pattern of high-brightness light. As semiconductor processes evolve to provide for smaller critical dimensions, and devices become smaller and increase in complexity, including the number of layers, a way of accurately patterning the features is desired in order to improve the quality, reliability, and yield of the devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 8-12 are top views of a substrate, a resist layer and a plurality of nozzles in accordance with some embodiments of the present disclosure.

DETAILED DESCRIPTION

Figure 1:
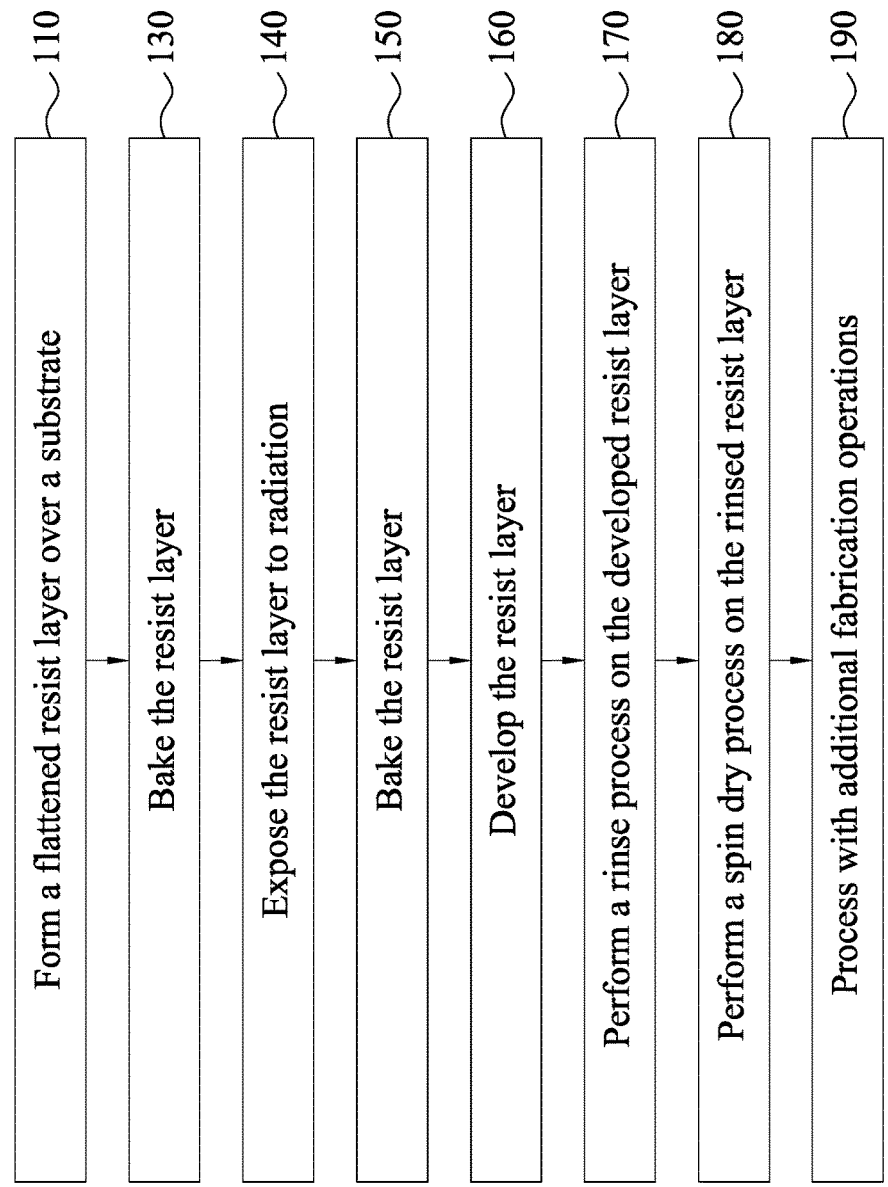
FIG. 1 is a flow chart of a method of manufacturing a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about", "approximately", or "substantially" shall generally mean within 20 percent, or within 10 percent, or within 5 percent of a given value or range. Numerical quantities given herein are approximate, meaning that the term "around", "about", "approximately", or "substantially" can be inferred if not expressly stated.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

Lithography may use one of two types of developing processes: a positive tone development (PTD) process and a negative tone development (NTD) process. The PTD process uses a positive tone developer, which refers to a developer that selectively dissolves and removes exposed portions of the resist layer. The NTD process uses a negative tone developer, which refers to a developer that selectively dissolves and removes unexposed portions of the resist layer. The PTD process uses aqueous-based developers and aqueous-based rinse solutions. The NTD process uses organic-based developers and organic-based rinse solutions. Both PTD processes and NTD processes have drawbacks when attempting to meet lithography resolution demands for advanced technology nodes. For example, both PTD processes and NTD processes have been observed to cause resist pattern swelling, leading to insufficient contrast between exposed portions and unexposed portions of the resist layer (in other words, poor resist contrast) and resulting in deformation, collapse, and/or peeling problems.

Some embodiments of this disclosure relate to a method of manufacturing a semiconductor device and more specifically to the semiconductor device including a resist layer over a substrate. Because a blowing gas process is performed after forming the resist layer, an edge of the resist layer can be flattened. As a result, the processing quality and the production yield are improved.

FIG. 1 is a flow chart of a method M of manufacturing a semiconductor device (e.g., including a substrate and a resist layer thereon) in accordance with some embodiments of the present disclosure. In some embodiments, the method M is implemented, in whole or in part, by a system employing advanced lithography processes, such as deep ultraviolet (DUV) lithography, extreme ultraviolet (EUV) lithography, e-beam lithography, x-ray lithography, and/or other lithography to enhance lithography resolution. For illustration, the method M will be described along with the drawings shown in FIGS. 3 and 16-22. The method M is merely an example, and is not intended to limit the present disclosure beyond what is explicitly recited in the claims. Additional operations can be provided before, during, and after the method M, and some operations described can be replaced, eliminated, or moved around for additional embodiments of the process. For clarity and ease of explanation, some elements of the figures have been simplified.

The operations of FIG. 1 are first introduced briefly and then elaborated in connection with FIGS. 2, 3, 4-5 and 15-22. At operation 110, a flattened resist layer is formed over a substrate. In some embodiments, the resist layer is a negative tone resist. In some other embodiments, the resist layer is a positive tone resist. In some embodiments, a blowing process is performed by using a nozzle to flatten the edge of the resist layer after the resist layer is deposited on the substrate.

Figure 2:
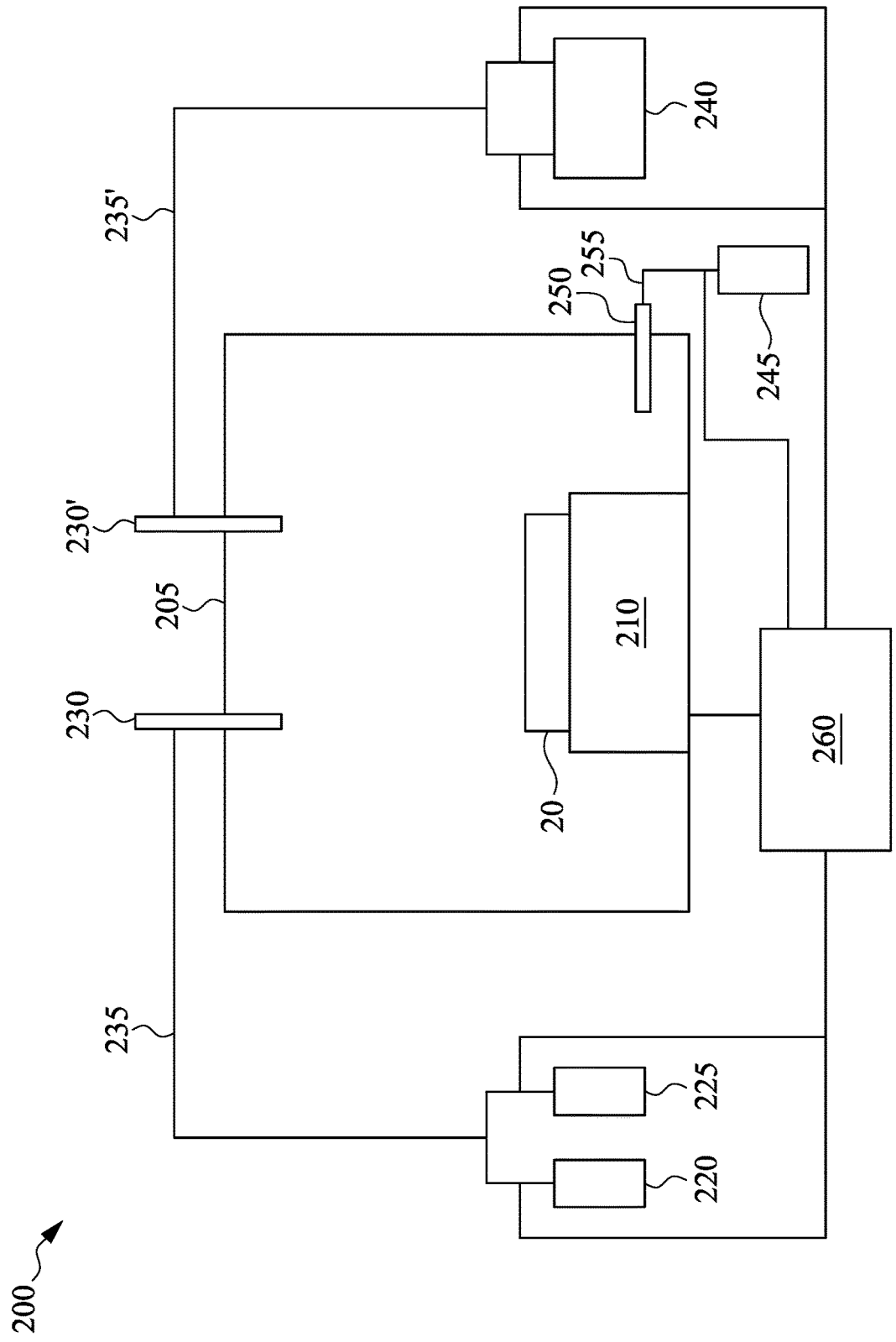
FIG. 2 illustrates a resist layer deposition apparatus in accordance with some embodiments of the present disclosure.
Figure 3:
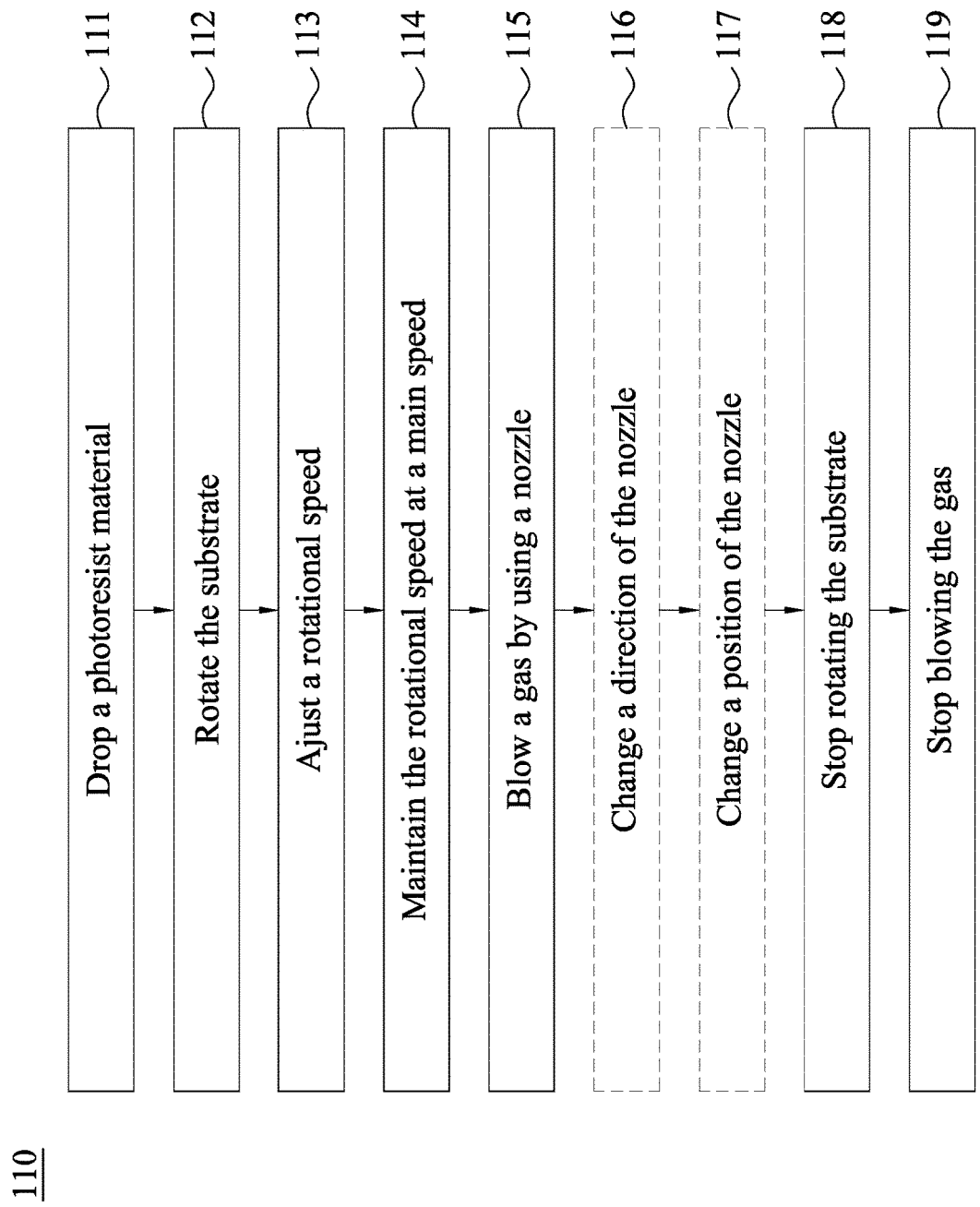
FIG. 3 is a flow chart of a method of manufacturing a semiconductor device in accordance with some embodiments of the present disclosure.

In some embodiments, the operation 110 includes multiple steps/operations and can be performed by using a resist layer deposition apparatus 200 shown in FIG. 2. FIG. 3 is a flow chart of the operation 110 of the method M in FIG. 1 in accordance with some embodiments of the present disclosure. For illustration, the flow chart of the operation 110 will be described along with the drawings shown in FIGS. 4-13. The flow chart shown in FIG. 3 is merely an example, and is not intended to limit the present disclosure beyond what is explicitly recited in the claims. Additional operations can be provided before, during, and after the operation 110, and some operations described can be replaced, eliminated, or moved around for additional embodiments of the process. For clarity and ease of explanation, some elements of the figures have been simplified.

Reference is made to FIG. 2. The deposition apparatus 200 includes a chamber 205. A substrate support stage 210 in the chamber 205 is configured for supporting a substrate 20, such as silicon wafer. In some embodiments, the substrate support stage 210 includes a heater. A first precursor or compound gas supply 220 and carrier/purge gas supply 225 are connected to an inlet (or nozzle) 230 in the chamber 205 through a gas line 235, and a gas supply 240 is connected to another inlet (or nozzle) 230' in the chamber 205 through another gas line 235'. The chamber 205 is evacuated, and excess reactants and reaction byproducts are removed by a pump 245 via an outlet 250 and an exhaust line 255. In some embodiments, the flow rate or pulses of precursor gases and carrier/purge gases, evacuation of excess reactants and reaction byproducts, pressure inside the chamber 205, and temperature of the chamber 205 or substrate support stage 210 are controlled by a controller 260 configured to control each of these parameters. In some embodiments, a lengthwise direction of the inlet (or nozzle) 230 is perpendicular to a lengthwise direction of the substrate 20. In some embodiments, a lengthwise direction of the inlet (or nozzle) 230' is perpendicular to the lengthwise direction of the substrate 20.

Figure 4:
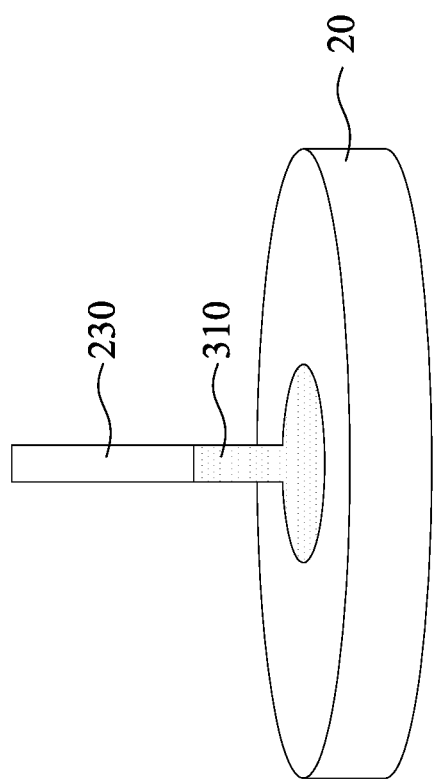
FIGS. 4-5, 6A-6B and 16-22 are cross-sectional views of the semiconductor device, in portion or entirety, at various fabrication stages in accordance with some embodiments of the present disclosure.
Figure 5:
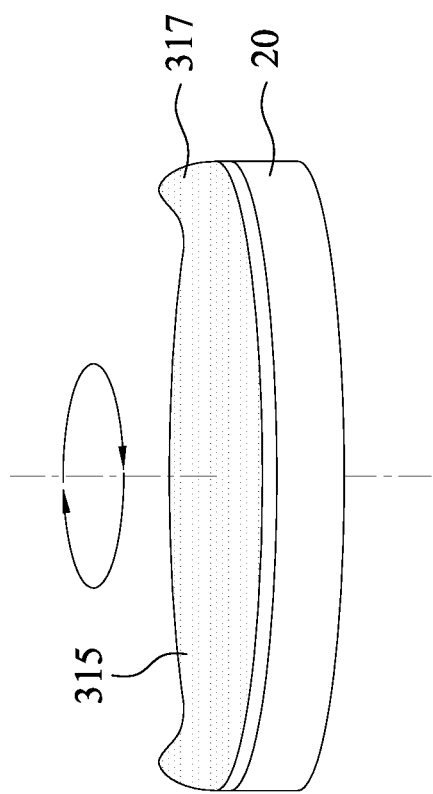

Reference is made to FIG. 3. At operation 111, a photoresist material is dropped over a substrate. Specifically, as shown in FIG. 4, a substrate 20 is provided. The substrate 20 may be a semiconductor substrate (e.g., a wafer), a mask (also called a photomask or reticle), or any base material on which processing may be conducted to provide layers of material to form various features of an IC device. Depending on an IC fabrication stage, the substrate 20 includes various material layers (e.g., dielectric layers, semiconductor layers, and/or conductive layers) configured to form IC features (e.g., doped regions/features, isolation features, gate features, source/drain features (including epitaxial source/drain features), interconnect features, other features, or combinations thereof). In some embodiments, the substrate 20 includes a semiconductor substrate, such as a silicon substrate. The substrate 20 may include another elementary semiconductor, such as germanium; a compound semiconductor, such as silicon carbide, gallium arsenide, gallium phosphide, indium phosphide, indium arsenide, and/or indium antimonide; an alloy semiconductor, such as SiGe, GaAsP, AlInAs, AlGaAs, GaInAs, GaInP, and/or GaInAsP; or combinations thereof. Alternatively, the substrate 20 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. In some embodiments, where the semiconductor device is fabricated into a mask for patterning IC devices, the substrate 20 can be a mask substrate that includes a transparent material (e.g., calcium fluoride ($CaF_2$)) or a low thermal expansion material (e.g., fused quartz, $TiO_2$ doped $SiO_2$, or other suitable low thermal expansion materials).

A resist layer (e.g., a resist layer 315 in FIG. 5) is formed over the substrate 20 by a suitable process. For example, as shown in FIG. 2, the substrate 20 can be disposed over the substrate support stage 210 of the deposition apparatus 200. The resist layer may be formed over the substrate 20 by dropping a photoresist material 310 through the nozzle 230, such that the photoresist material 310 is deposited on the center of the substrate 20. The resist layer is also called a photoresist layer, photosensitive layer, imaging layer, patterning layer, or radiation sensitive layer. The resist layer is sensitive to radiation used during a lithography exposure process, such as DUV radiation, EUV radiation, e-beam radiation, ion beam radiation, and/or other suitable radiation. In some embodiments, the resist layer includes a material sensitive to EUV radiation.

In some embodiments, the photoresist material 310 includes a positive tone material (sometimes called a positive tone resist). When a developer is a positive tone developer (PTD), portions of the positive tone resist exposed to radiation become soluble to the developer, and unexposed portions of the positive tone resist remain insoluble to the developer. When a developer is a negative tone developer (NTD), portions of the positive tone resist exposed to radiation become insoluble to the developer, and unexposed portions of the positive tone resist remain soluble (or exhibit increased solubility) to the developer. For example, when the negative tone developer such as a hydrophobic organic solvent applied to the exposed portions of the positive tone resist, the unexposed (hydrophobic) portions of the positive tone resist are dissolved by the NTD and the exposed (hydrophilic) portions of the positive tone resist remain after the developing process to form a patterned resist layer.

In some other embodiments, the resist layer includes a negative tone material (sometimes called a negative tone resist). When a developer is the positive tone developer, portions of the negative tone resist exposed to radiation become insoluble (or exhibit decreased solubility) to the developer, and unexposed portions of the negative tone resist remain soluble to the developer. When a developer is a negative tone developer (NTD), portions of the negative tone resist exposed to radiation become soluble to the developer, and unexposed portions of the negative tone resist remain insoluble to the developer.

At operation 112 in FIG. 3, the substrate is rotated at an initial speed, and at operation 113, a rotational speed of the substrate is adjusted (e.g., increased) to a main speed. For example, in FIGS. 2 and 5, the controller 260 controls the substrate support stage 210, such that the substrate support stage 210 starts rotates, and the substrate 20 is rotated accordingly to spread the photoresist material 310. In some embodiments, the substrate support stage 210 rotates at a low speed (initial speed) at first, and then the rotational speed of the substrate support stage 210 is increased to a main speed. With the main speed, the photoresist material 310 can be spread to the edge of the substrate 20 by centrifugal force. It may take about 0.05 seconds to about 1 second to increase the rotational speed from the initial speed to the main speed. The main speed is referred as a maximum speed during rotating the substrate 20.

Figure 6A:
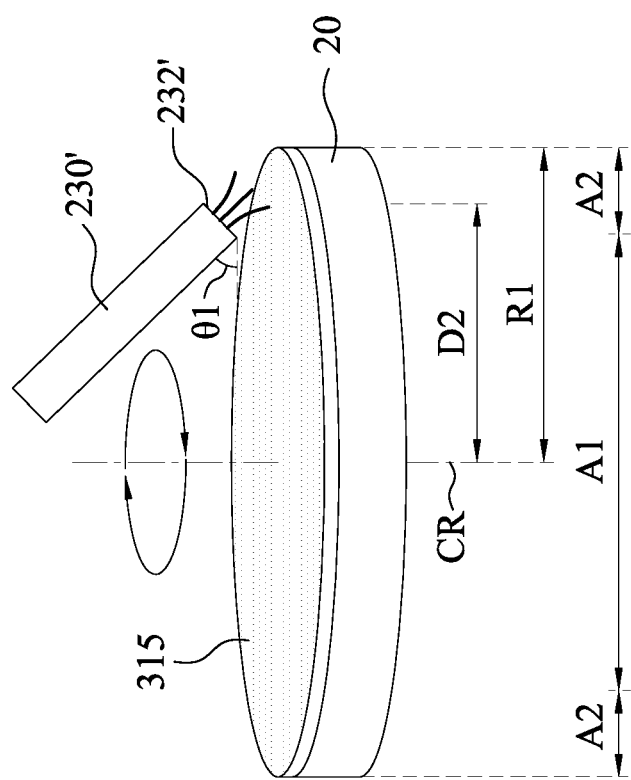

At operation 114 in FIG. 3, the rotational speed is maintained at the main speed. Maintaining the rotational speed at main speed is configured to control a height of the resist layer over the substrate 20. As shown in FIG. 6A, when the substrate 20 is rotated, most portions of the photoresist material 310 are spread to the edge of the substrate 20, such that the resulting resist layer 315 has a hump 317 at the edge of the substrate 20 due to surface tension. Since the thickness of the hump 317 is much greater than a thickness of the resist layer 315 at the center of the substrate 20, the patterning of the resist layer 315 at the hump 317 may be inaccurate.

The embodiments of the present disclosure solve issues in existing approaches by performing a blowing gas process to the hump of the resist layer. At operation 115 in FIG. 3, a gas is blown to an edge of the substrate when rotating the substrate. For example, in FIGS. 6A and 6B, the blowing gas process is performed to flatten the hump 317 of the resist layer 315 such that a flatted resist layer 315' (see FIG. 8) is formed. In other words, the blowing gas process is performed to the hump 317 of the resist layer 315 to reduce a height of the hump 317. In some embodiments, if the gas is blown before the rotational speed is adjusted (e.g., increased) to the main speed (e.g., at the initial speed), the photoresist material 310 would not be coated on the entire substrate 20.

In some embodiments, the blowing gas process is performed by using the nozzle 230' to blow a gas onto the resist layer 315. In some embodiments, the gas does not (chemically) react with the resist layer 315 and includes argon (Ar), nitrogen ($N_2$), air, combinations thereof, or other suitable gases. In some embodiments, a gas flow of the blowing gas process is about 500 sccm to about 10000 sccm. In some embodiments, the blowing gas process utilizes a pressure of about 0.5 kPa to about 100 kPa. If the gas flow and/or the pressure of the blowing gas process is out of such range(s), the hump 317 may remain on the edge of the substrate 20.

In some embodiments, the nozzle 230' is disposed over the edge of the substrate 20. In other words, the nozzle 230' is disposed over an edge of the resist layer 315. For example, the substrate 20 has a center region A1 and an edge region A2 surrounding the center region A1. The outlet 232' of the nozzle 230' is directly above the edge region A2 of the substrate 20 during the blowing gas process. The blowing gas process by using the nozzle 230' may eliminate or remove the hump of the resist layer 315 on the edge of the substrate 20 such that the edge of the resist layer 315 can be flattened and the flattened resist layer 315' is formed. As a result, the patterning of the resist layer 315' at the edge of the substrate 20 can be accurate. A distance D2 between the outlet 232' of the nozzle 230' and a center CR of the resist layer 315 (or the substrate 20) is in a range of about 120 millimeters to about 150 millimeters. In some embodiments, a ratio of the distance D2 between the outlet 232' of nozzle 230' and the center CR of the resist layer 315 (or the substrate 20) to a radius R1 of the substrate 20 is in a range of about 0.8 to about 1. As such, the edge of the resist layer 315 can be flattened, thereby improving the process window.

In some embodiments, the blowing gas process is performed by using the nozzle 230' with an angle θ1 with respect to a top surface of the substrate 20. The angle θ1 between the nozzle 230' and the top surface of the substrate 20 (or the resist layer 315) is in a range of about 40 degrees (see FIG. 6A) to about 90 degrees (see FIG. 6B). As such, the hump 317 of the resist layer 315 can be pushed out. In some embodiments, during a period of the blowing gas process, the angle θ1 between the nozzle 230' and the substrate 20 is fixed.

Figure 6B:
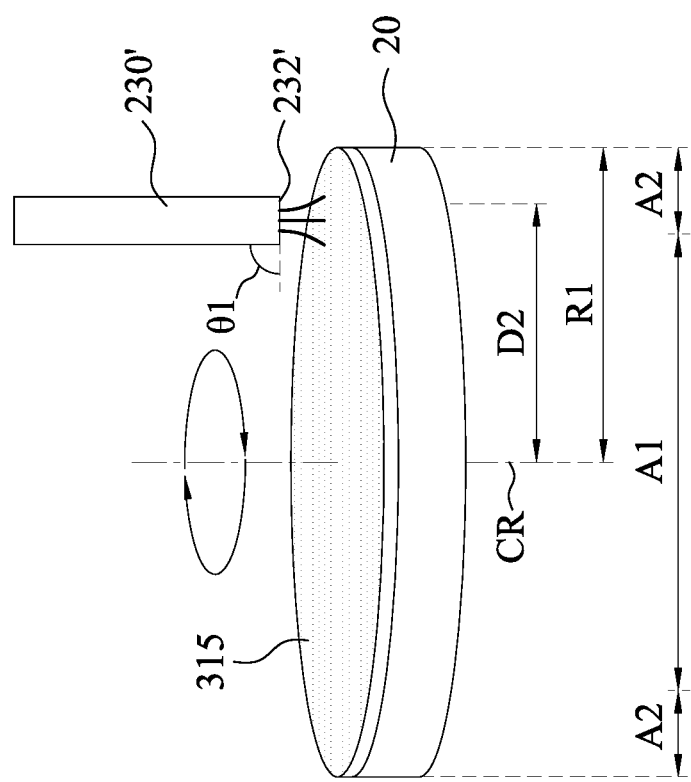
Figure 7:
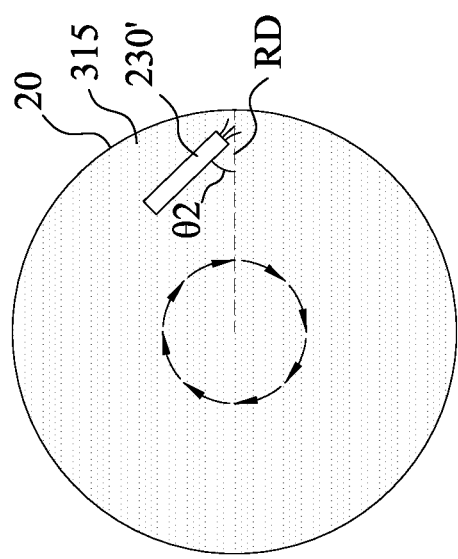
FIG. 7 is a top view of the semiconductor device of FIG. 6A.

FIG. 7 is a top view of the substrate 20, the resist layer 315, and the nozzle 230' in FIGS. 6A and 6B. Referring to FIGS. 6A to 7, the nozzle 230' is inclined with respect to a radial direction RD of the substrate 20 and form an angle θ2 with respect to the radial direction RD. For example, the substrate 20 is rotated clockwise, and the nozzle 230' blows the gas in the clockwise direction, and vice versa. That is, the gas is blown by the nozzle 230' in a direction (e.g., the clockwise direction) substantially the same as a rotation direction (e.g., the clockwise direction) of the substrate 20. In some embodiments, the angle θ2 between the nozzle 230' and the radial direction RD is in a range of about 0 degree to about 90 degrees. If the angle θ2 of the nozzle 230' is out of such range, the hump 317 may remain on the edge of the substrate 20.

In some other embodiments, the configuration of the nozzle 230' can be different. FIGS. 8-12 are top views of the substrate 20, the resist layer 315, and a plurality of the nozzles 230' in accordance with some other embodiments of the present disclosure. A plurality of nozzles 230' are along the rotation direction (or spin direction) of the substrate 20 (see FIG. 5) and tangent with the edge of the substrate 20 (or the resist layer 315). As shown in FIG. 8, the nozzles 230' are two nozzles and evenly disposed adjacent a circumference of the resist layer 315. For example, the nozzles 230' are about 180 degrees apart. As shown in FIG. 9, the nozzles 230' are three nozzles and evenly disposed adjacent the circumference of the resist layer 315. For example, the nozzles 230' are about 120 degrees apart. As shown in FIG. 10, the nozzles 230' are four nozzles and evenly disposed adjacent the circumference of the resist layer 315. For example, the nozzles 230' are about 90 degrees apart. As shown in FIG. 11, the nozzles 230' are five nozzles and evenly disposed adjacent the circumference of the resist layer 315. For example, the nozzles 230' are about 72 degrees apart. As shown in FIG. 12, the nozzles 230' are six nozzles and evenly disposed adjacent the circumference of the resist layer 315. For example, the nozzles 230' are about 60 degrees apart.

At operation 118 in FIG. 3, rotating the substrate is stopped. In some embodiments, the rotational speed of the substrate is decreased from the main speed to zero after the rotational speed is maintained at the main speed. At operation 119 in FIG. 3, blowing the gas is stopped. In some embodiments, the rotational speed of the substrate 20 is gradually decreased from the main speed until the rotational speed of the substrate 20 is stopped (i.e., the rotational speed is zero). After stopping rotating the substrate 20, blowing the gas is stopped (e.g., the operation 119 of the FIG. 3). For example, as shown in FIG. 2, the controller 260 stops rotating the substrate support stage 210, and then the controller 260 controls the gas supply 240, such that the gas supply 240 stops providing gas to the nozzle 230'.

Figure 13:
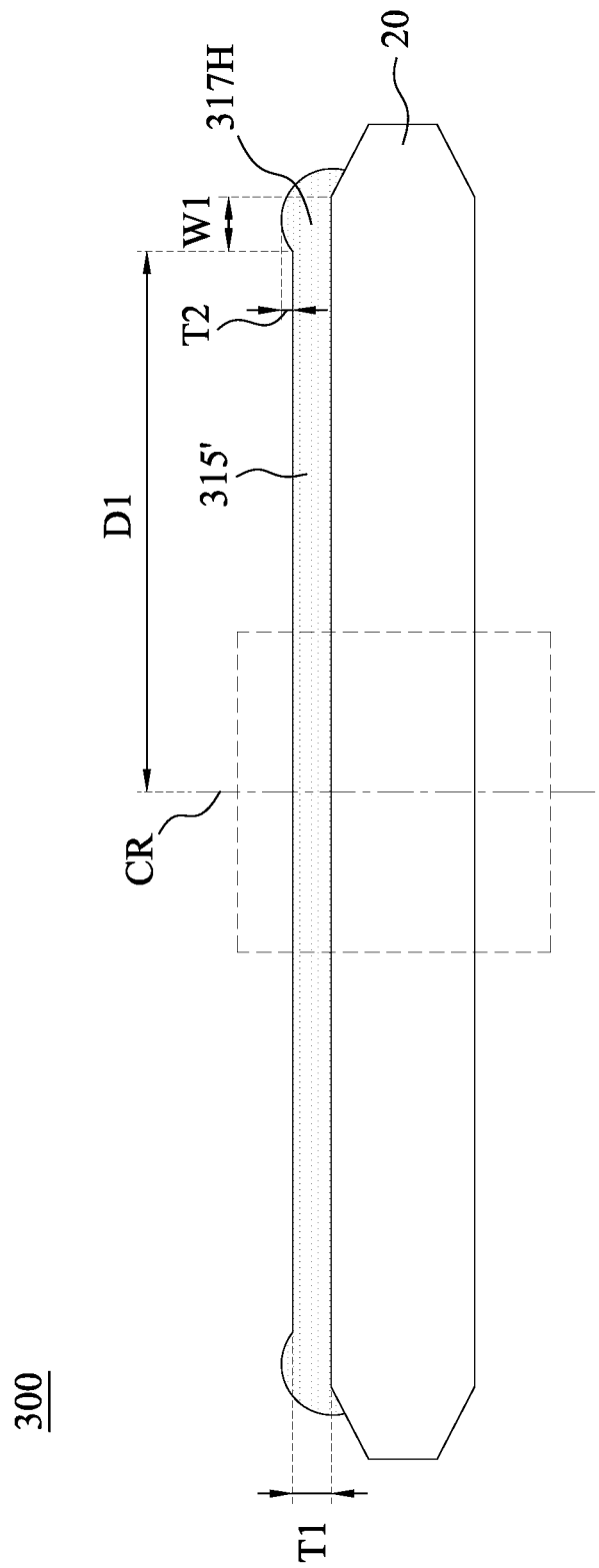
FIG. 13 is a schematic view of a semiconductor device in accordance with some other embodiments of the present disclosure.

As such, after the operation 110 in FIG. 1, a flattened resist layer 315' is formed over the substrate 20, as shown in FIG. 13. FIG. 13 is a schematic view of a semiconductor device after performing the operation 110 in FIG. 1. In some embodiments, the resist layer 315' has a thickness T1 in a range of about 25 nanometers to 250 nanometers. In some embodiments, the resist layer 315' has the hump 317H over the edge of the substrate 20. The hump 317H of the resist layer 315' may have a thickness T2 smaller than 40 nanometers. In some embodiments, since the resist layer 315' is completely flatten, the thickness T2 of the resist layer 315' is substantially zero and thus the hump does not exist. In some other embodiments, the blowing gas process (operation 115 in FIG. 3) is performed such that the resist layer 315' is partially etched at the edge of the resist layer 315'. That is, a top surface of the edge of the resist layer 315' is lower than a top surface of a center CR of the resist layer 315'. For example, a difference between the top surface of the edge of the resist layer 315' and the top surface of the center CR of the resist layer 315' is in a range of about 0 to about 40 nanometers.

In some embodiments, a distance D1 between the center CR of the resist layer 315' and the hump 317H of the resist layer 315' is in a range of about 145 micrometers to about 155 micrometers. In some embodiments, a width W1 of the hump 317H of the resist layer 315' is in a range of about 0.2 millimeters to about 0.5 millimeters.

In some other embodiments, the operation 110 in FIG. 3 further includes the operation 116, where a direction of the nozzle is changed during the period of the blowing gas process. In greater details, as shown in FIGS. 6A and 6B, during the operation 115, the angle θ1 between the nozzle 330 and the substrate 20 is adjusted from a first angle (e.g., about 40 degrees) to a second angle (e.g., about 90 degrees) greater than the first angle. For example, the blowing gas process is performed by using the nozzle 230' with the first angle to push out the hump 317 of the resist layer 315 in FIG. 6A. Then, the nozzle 230' is adjusted from the first angle (see FIG. 6A) to the second angle (see FIG. 6B) so as to flatten the hump 317 of the resist layer 315.

In some other embodiments, the operation 110 in FIG. 3 further includes the operation 117, where a position of the nozzle is changed during the period of the blowing gas process. For example, as shown in FIG. 6A, during the period of the blowing gas process, the nozzle 230' is moved toward the edge of the resist layer 315 such that the hump 317 of the resist layer 315 can be pushed out.

Figure 14:
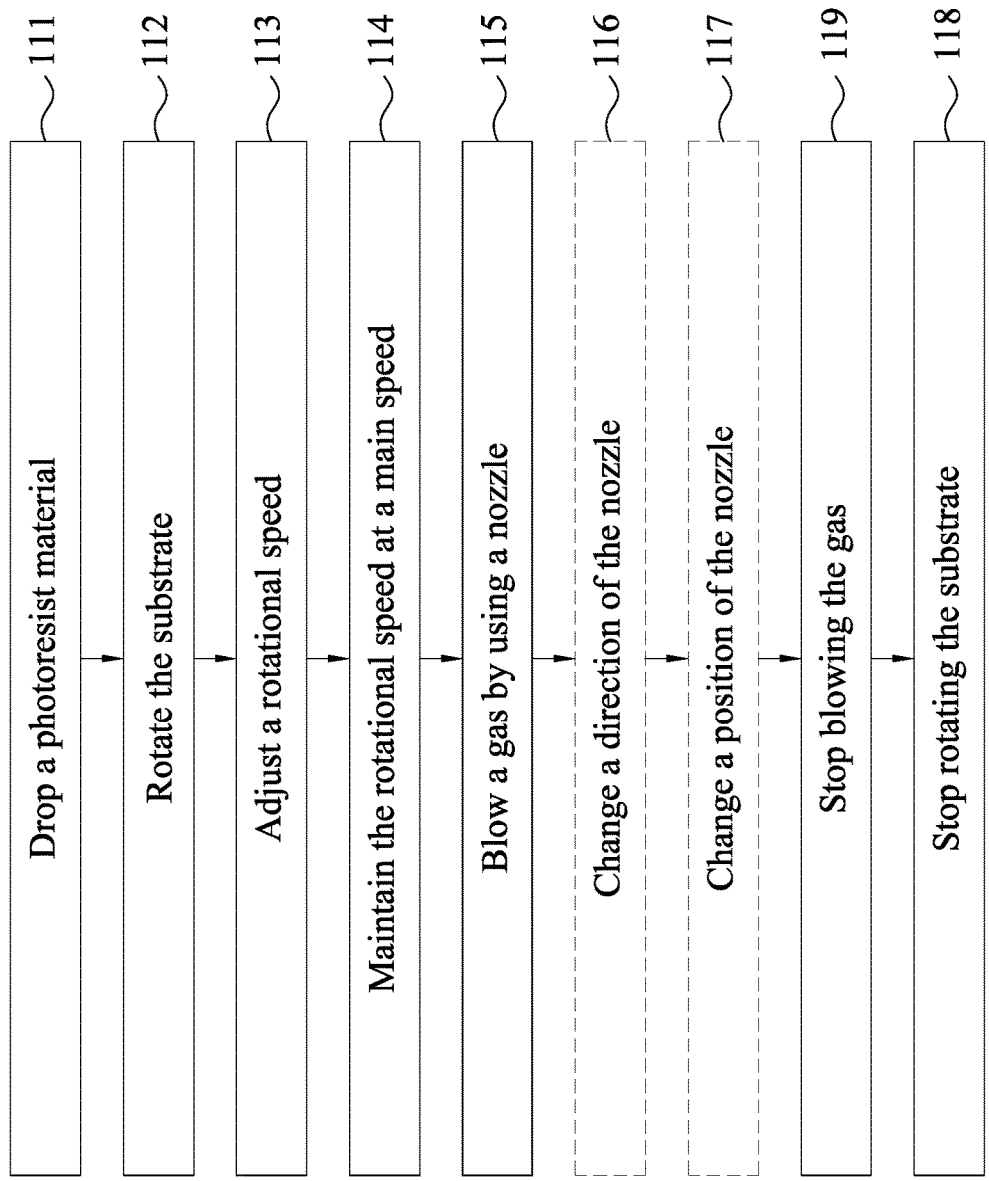
FIG. 14 is a flow chart of a method of manufacturing a semiconductor device in accordance with some embodiments of the present disclosure.

FIG. 14 is a flow chart of the operation 110 in FIG. 1 in accordance with some other embodiments of the present disclosure. The operation 110 of FIG. 14 is similar to the operation 110 of FIG. 3 except that the operation 110 of FIG. 14 performs different operations after blowing the gas. That is, the operation 119 is performed prior to the operation 118 in FIG. 14. Other relevant operation details of the operation 110 of FIG. 14 are similar to or the same as the operation 110 of FIG. 3, and, therefore, a description in this regard will not be repeated hereinafter.

Figure 15:
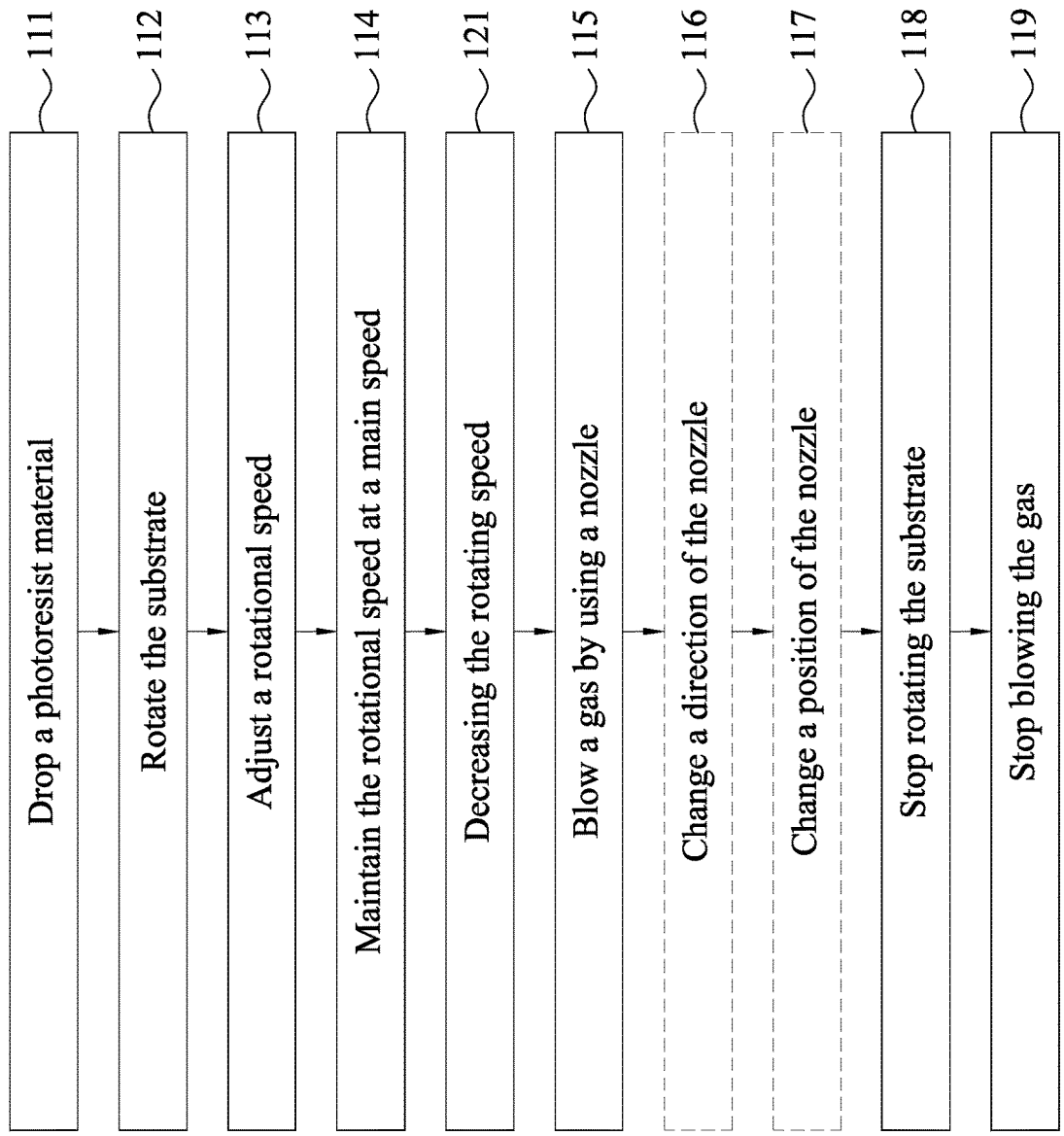
FIG. 15 is a flow chart of a method of manufacturing a semiconductor device in accordance with some embodiments of the present disclosure.

FIG. 15 is a flow chart of the operation 110 in FIG. 1 in accordance with some other embodiments of the present disclosure. The operation 110 of FIG. 15 is similar to the operation 110 of FIG. 3 except that the operation 110 of FIG. 15 further includes an operation 121 between the operations 114 and 115. At the operation 121, the rotational speed is decreased. For example, as shown in FIG. 6A, the substrate 20 may be rotated at the initial speed, and then the rotational speed is increased until the rotational speed is equal to the main speed. Thereafter, the rotational speed is decreased from the main speed to a first speed. That is, the first speed herein may be greater than the initial speed and smaller than the main speed. The gas is blown while decreasing the rotational speed at the first speed by using the nozzle 230'. The operation 110 of FIG. 15 proceeds to the operation 118 where rotating the substrate is stopped. After the operation 118, the operation 110 of FIG. 15 proceeds to the operation 119 where blowing the gas is stopped. In some embodiments, blowing the gas is stopped (i.e., the operation 119) prior to stopping rotating the substrate (i.e., the operation 118). Other relevant operation details of the operation 110 of FIG. 15 are similar to or the same as the operation 110 of FIG. 3, and, therefore, a description in this regard will not be repeated hereinafter.

Figure 16:
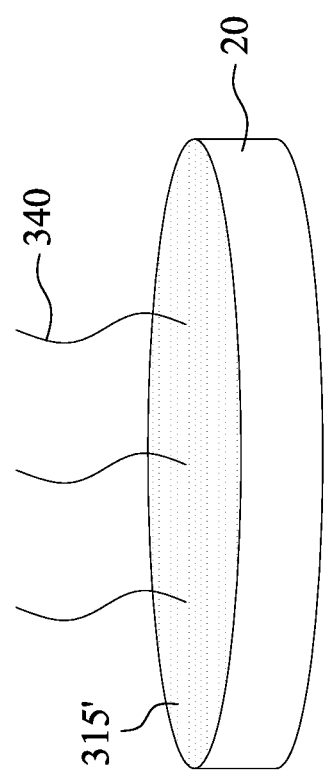

Reference is made to FIG. 1 and FIG. 16. At operation 130 of FIG. 1, the resist layer is baked at an elevated temperature using a pre-exposure baking process to evaporate solvents in the resist layer in some embodiments. Superficially, after the edge of the resist layer 315' is flatten, a baking process 340 is performed on the resist layer 315' to cure and dry the resist layer 315' to radiation exposure. In some embodiments, the baking process 340 is a pre-bake process. In some embodiments, the curing and drying of the resist layer 315' removes the solvent component while leaving behind polymer resins, PACs, cross-linking agent, and other chosen additives. In some embodiments, the baking process 340 is performed at a temperature suitable to evaporate the solvent, and the temperature depends upon the materials chosen for the resist. The baking process 340 is performed for a time sufficient to cure and dry the resist layer 315'.

Figure 17:
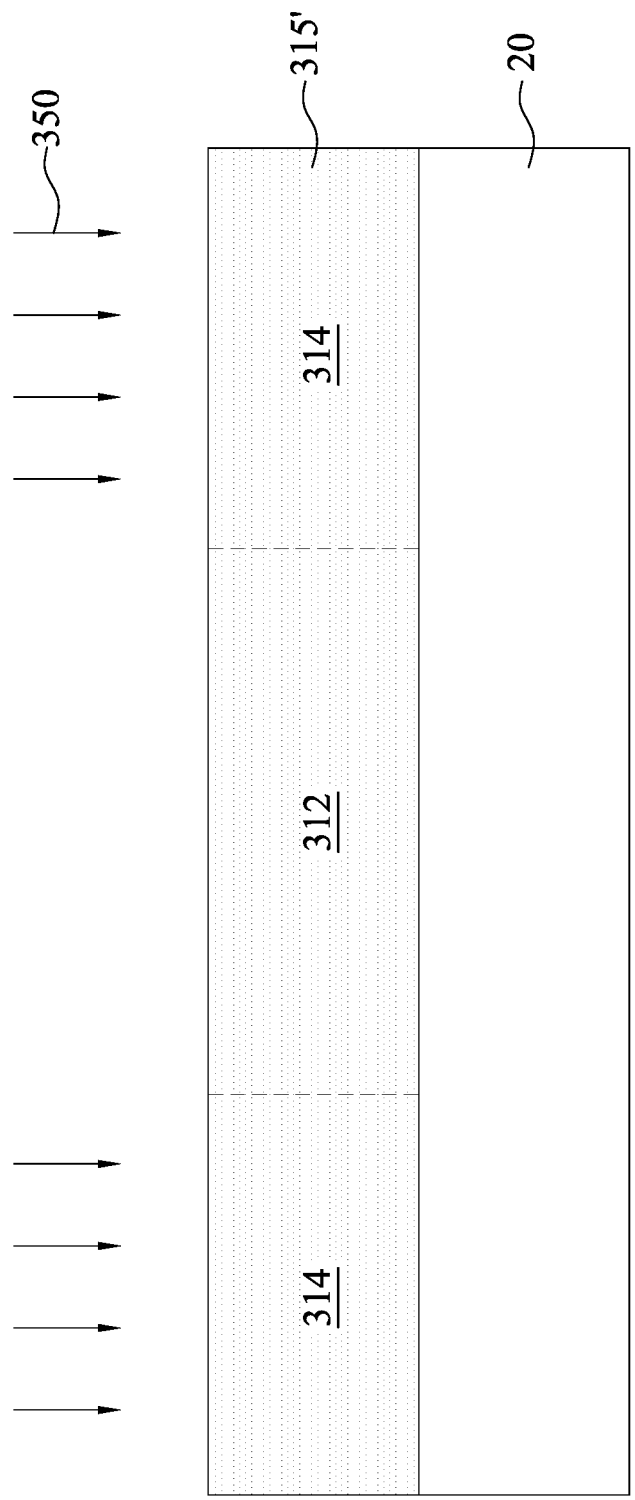

At operation 140 of FIG. 1, the resist layer is exposed to radiation in the form of electromagnetic waves. In FIG. 17, an exposure process is performed on the resist layer 315', where the resist layer 315' is illuminated with patterned radiation 350. For clarity, FIG. 17 shows an enlarged view of the substrate 20 and the resist layer 315'. In some embodiments, the patterned radiation 350 has a wavelength less than about 250 nm, such as DUV radiation (e.g., 248 nm radiation from a KrF laser or 193 nm radiation from an ArF laser), EUV radiation, x-ray radiation, e-beam radiation, ion-beam radiation, and/or other suitable radiation. In some embodiments, the patterned radiation 350 is EUV radiation, which may refer to radiation having a wavelength of about 1 nm to about 100 nm. In some embodiments, the EUV radiation has a wavelength of about 10 nm to about 15 nm (e.g., about 13.5 nm). The exposure process can be in air or liquid (immersion lithography), or vacuum (e.g., when implementing EUV lithography and/or e-beam lithography). In some embodiments, the radiation is patterned using a mask having an IC pattern defined therein, such that the patterned radiation forms an image of the IC pattern on the resist layer 315'. The mask transmits, absorbs, and/or reflects the radiation depending on the IC pattern, along with mask technologies used to fabricate the mask. In some embodiments, the radiation beam is patterned by directly modulating the radiation beam according to an IC pattern without using a mask (sometimes called maskless lithography).

A latent pattern is formed on the resist layer 315' by the exposure process. The latent pattern is formed on the resist layer 315', which eventually becomes a physical resist pattern when the resist layer 315' is subjected to developing and rinsing processes. The resist layer 315' may include a negative tone material and have unexposed portions 312 (which may include both unexposed portions and underexposed portions of resist layer 315') and exposed portions 314. As shown in FIG. 17, the exposed portions 314 physically and/or chemically change in response to the exposure process. For example, PAC components in the exposed portions 314 of the resist layer 315' generate acid upon absorbing radiation, which functions as a catalyst for causing chemical reactions that increase solubility of the exposed portions 314.

At operation 150 of FIG. 1, the exposed resist layer is baked at an elevated temperature using a post-exposure baking process. Specifically, after the exposure process, a post-exposure baking (PEB) process may be performed on the resist layer 315'. PEB can promote the cross-linking of polymer and/or suppression of reactions of other resist components with the polymer. Depending on the polymer(s) included in the resist layer 315', PEB may catalyze a reaction between reacted photosensitive moieties and the polymer in the resist layer 315'. Any suitable baking conditions (e.g., duration or temperature profiles, baking cycles) may be used. In some embodiments, the exposure process and/or the PEB process increase the polarity of the exposed portions 314, increasing solubility of the exposed portions 314 to a developer with relatively high polarity (e.g., the aqueous-based solution). In contrast, the polarity of the unexposed portions 312 remains low (or increases less than the exposed portions 314) after the PEB process, so the unexposed portions 312 are less soluble in a developer with relatively high polarity (e.g., the aqueous-based solution).

Figure 18:
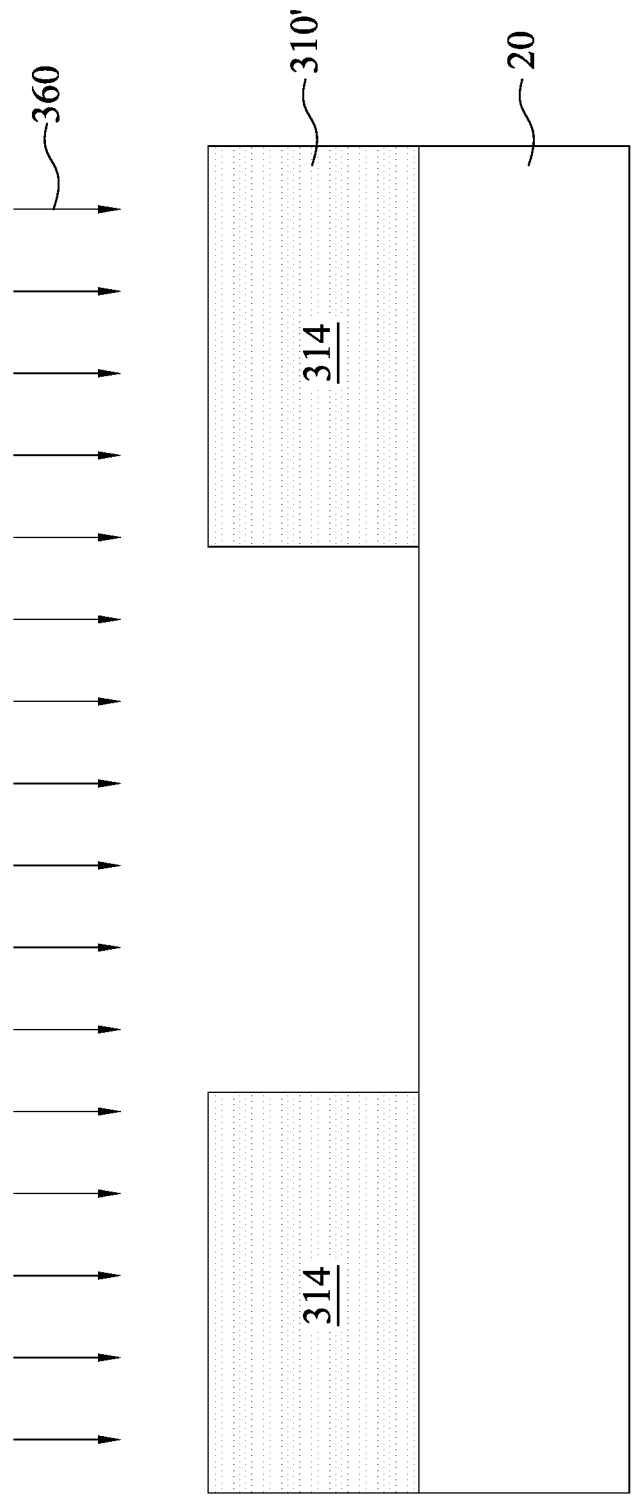

At operation 160 of FIG. 1, the baked resist layer is developed using a developer, which is an aqueous-based solution. Reference is made to FIG. 18. A developing process is performed on the resist layer 315', thereby forming a patterned resist layer 310'. In some embodiments, a developing process is performed to remove the exposed portions 314 of the resist layer 315'. For example, a developer 360 is a NTD developer and applied to the resist layer 315' that dissolves the portions 312, leaving the patterned resist layer 310' having opening(s) defined therein between the portions 314 (collectively called a resist pattern). That is, the portions 314 are remained. Applying the NTD developer 360 may include spraying the developer 360 on the patterned resist layer 310' by a spin-coating process.

Figure 19:
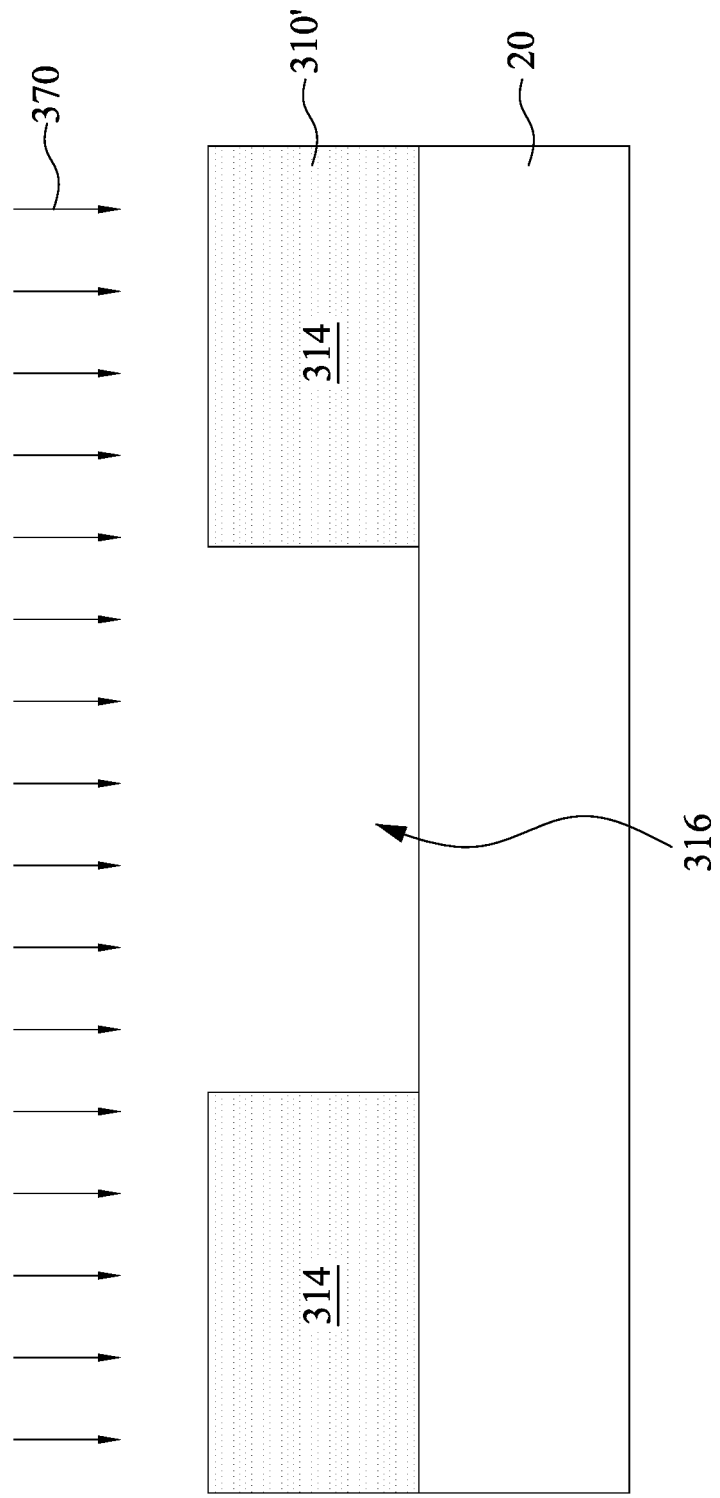

At operation 170 in FIG. 1, a rinse process is performed on the developed resist layer using a basic aqueous rinse solution. Reference is made to FIG. 19. A rinse process is performed after the developing process, for example, to remove any residue and/or particles from the semiconductor device. In some embodiments, a rinse solution 370 is applied to the patterned resist layer 310' to remove unwanted materials. The rinse solutions may use organic solvent.

Figure 20:
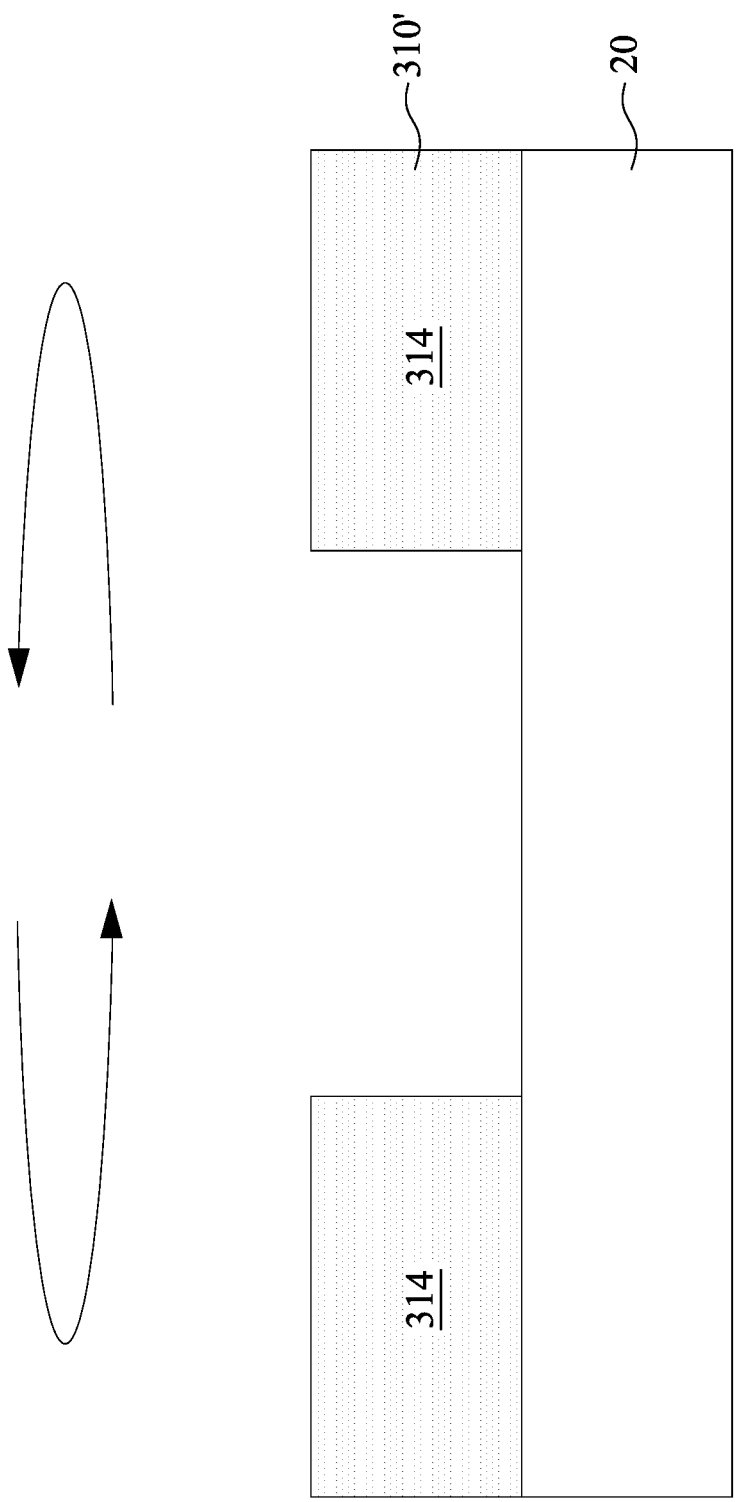

At operation 180 in FIG. 1, a spin dry process is performed on the rinsed resist layer. Reference is made to FIG. 20. A spin dry process is performed on the patterned resist layer 310' to further remove any liquids and/or solids remaining on the patterned resist layer 310' after the rinsing process. The rinsing solution 370 of FIG. 19 may be substantially removed by the spin dry process. During the spin dry process, the rinsing solution of FIG. 19 is spun away from the substrate center towards the substrate edge and then removed.

Note that additional operations can be provided before, during, and after method M, and some of the operations described can be moved, replaced, or eliminated for additional embodiments of the method M. For example, at operation 190, the method M can proceed with additional fabrication operations on the semiconductor device. In some embodiments, the operation 190 includes a fabrication process using the patterned resist layer as a mask to pattern the material layer on the semiconductor device. Specifically, the material layer is etched, such that the material layer includes a pattern corresponding with a pattern of the patterned resist layer. In some embodiments, doped regions are formed in the material layer, such that the material layer includes a doped pattern corresponding with a pattern of the patterned resist layer.

Figure 21:
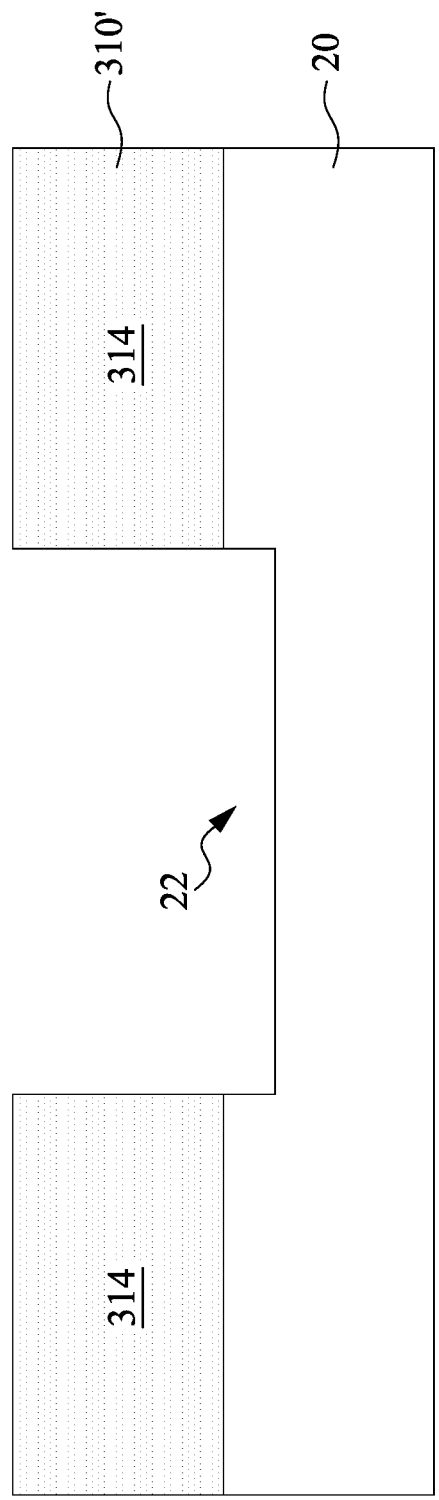
Figure 22:
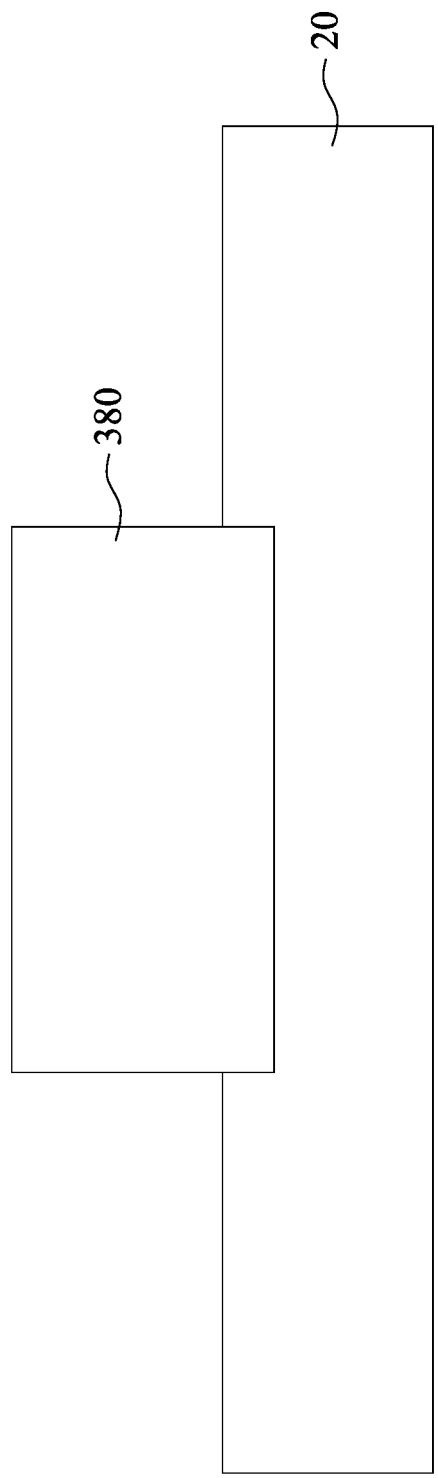

Reference is made to FIG. 20 and FIG. 21. An additional fabrication process is performed on the semiconductor device using the patterned resist layer 310' as a mask. For example, the fabrication process is applied within opening(s) 316 (see FIG. 20) of the patterned resist layer 310', while other portions of the semiconductor device covered by the patterned resist layer 310' are protected from being impacted by the fabrication process. In some embodiments, a pattern of the opening 316 in the resist layer 310' is extended into the layer to be patterned or substrate 20 to create a pattern of opening(s) 22 in the substrate 20, thereby transferring the pattern in the resist layer 310' into the substrate 20'. The pattern is extended into the substrate 20' by etching, using one or more suitable etchants. The resist layer 310' is at least partially removed during the etching operation in some embodiments. In other embodiments, the resist layer 310' is removed after etching the substrate 20' by using a suitable photoresist stripper solvent or by a photoresist ashing operation. In some embodiments, a deposition process is performed to fill the opening(s) 22 of the substrate 20 with a material, thereby forming IC features (e.g., conductive material lines 380) over the substrate 20 as shown in FIG. 22. Thereafter, as depicted in FIG. 22, the patterned resist layer 310' is removed from the semiconductor device.

Based on the above discussions, it can be seen that the present disclosure offers advantages. It is understood, however, that other embodiments may offer additional advantages, and not all advantages are necessarily disclosed herein, and that no particular advantages are required for all embodiments. One advantage is that the blowing process can flatten the edge of the resist layer, thereby improving the processing quality and the production yield. Another advantage is that the manufacturing cost can be reduced since the product yield is improved.

According to some embodiments, a method of manufacturing a semiconductor device includes depositing a photoresist material over a substrate. The substrate is rotated to spread the photoresist material. A gas is blown to an edge of the substrate when rotating the substrate. Rotating the substrate is stopped. Blowing the gas is stopped.

According to some embodiments, a method of manufacturing a semiconductor device includes forming a resist layer over a substrate, in which the resist layer includes a hump at an edge of the substrate. The substrate is rotated. A blowing gas process is performed to the hump to reduce a height of the hump. Blowing the gas is stopped. Rotating the substrate is stopped.

According to some embodiments, a method of manufacturing a semiconductor device includes depositing a photoresist material over a substrate. The substrate is rotated with the photoresist material at a first speed. A rotational speed of the substrate is decreased to a second speed lower than the first speed. A gas is blown by using a nozzle on the photoresist material at the second speed. Rotating the substrate is stopped. Blowing the gas is stopped.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   depositing a photoresist material over a substrate;
   rotating the substrate to spread the photoresist material;
   blowing a gas to an edge of the substrate when rotating the substrate;
   stopping rotating the substrate; and
   stopping blowing the gas.

2. The method of claim 1, further comprising adjusting a rotational speed of the substrate prior to blowing the gas to an edge of the substrate.

3. The method of claim 2, further comprising maintaining the rotational speed at a main speed after adjusting the rotational speed.

4. The method of claim 3, wherein blowing the gas is performed at the main speed.

5. The method of claim 1, wherein blowing the gas is performed by using a nozzle with an angle, and the angle between the nozzle and the substrate is in a range of 40 degrees to 90 degrees.

6. The method of claim 5, wherein blowing the gas further comprises changing a direction of the nozzle.

7. The method of claim 5, wherein blowing the gas further comprises changing a position of the nozzle.

8. The method of claim 5, wherein a ratio of a distance between the nozzle and a center of the substrate to a half-length of the substrate is in a range of 0.8 to 1.

9. The method of claim 1, wherein rotating the substrate is stopped prior to blowing the gas.

10. A method comprising:
    forming a resist layer over a substrate, wherein the resist layer comprises a hump at an edge of the substrate;
    rotating the substrate;
    performing a blowing gas process to the hump to reduce a height of the hump;
    stopping performing the blowing gas process; and
    stopping rotating the substrate.

11. The method of claim 10, wherein the blowing gas process is performed by using a plurality of nozzles disposed adjacent a circumference of the resist layer in a top view.

12. The method of claim 11, wherein during the blowing gas process, at least one of the nozzles is moved toward an edge of the resist layer.

13. The method of claim 10, wherein performing the blowing gas process comprises:
    blowing a gas in a direction substantially the same as a rotation direction of the substrate.

14. The method of claim 10, wherein the blowing gas process is performed by using argon (Ar), nitrogen ($N_2$), air, or combinations thereof.

15. A method comprising:
    depositing a photoresist material over a substrate;
    rotating the substrate to spread the photoresist material;
    blowing a gas to the substrate in a rotation direction of the substrate using a nozzle;
    stopping rotating the substrate; and
    stopping blowing the gas.

16. The method of claim 15, wherein blowing the gas is performed prior to stopping rotating the substrate.

17. The method of claim 15, wherein blowing the gas comprises changing a direction of the nozzle.

18. The method of claim 15, wherein blowing the gas comprises changing a position of the nozzle.

19. The method of claim 15, wherein blowing the gas is performed by using argon (Ar), nitrogen ($N_2$), air, or combinations thereof.

20. The method of claim 1, wherein blowing the gas is performed by using plurality of nozzles along a rotation direction of the substrate when rotating the substrate.

* * * * *